United States Patent
Wu et al.

(10) Patent No.: US 10,121,849 B2
(45) Date of Patent: Nov. 6, 2018

(54) METHODS OF FABRICATING A SEMICONDUCTOR STRUCTURE

(71) Applicant: Micron Technology, Inc., Boise, ID (US)

(72) Inventors: Tieh-Chiang Wu, Taoyuan (TW); Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/941,665

(22) Filed: Nov. 16, 2015

(65) Prior Publication Data
US 2017/0141185 A1     May 18, 2017

(51) Int. Cl.
*H01L 49/02*     (2006.01)
*H01L 21/304*     (2006.01)
(Continued)

(52) U.S. Cl.
CPC .......... *H01L 28/91* (2013.01); *C23C 14/0652* (2013.01); *C23C 14/08* (2013.01);
(Continued)

(58) Field of Classification Search
CPC ... H01L 2224/05552; H01L 2224/0557; H01L 2224/06181; H01L 2924/00014; H01L 2924/0002; H01L 21/76898; H01L 2223/6616; H01L 2223/6622; H01L 2225/06527; H01L 2225/06541; H01L 23/642; H01L 25/0657; H01L 28/60; H01L 28/90; H01L 29/66181; H01L 29/92; H01L 21/76877; H01L 21/76895; H01L 21/7684;
(Continued)

(56) References Cited

U.S. PATENT DOCUMENTS 8,294,240 B2    10/2012    Nowak et al.
8,455,363 B2 *    6/2013    Lee ..................... H01L 21/3065
                                                  257/E21.214
(Continued)

FOREIGN PATENT DOCUMENTS

CN        102386240 A     3/2012
CN        103346148 A    10/2013

OTHER PUBLICATIONS

Taiwanese Office Action and Search Report from Taiwanese Application No. 105104488, dated Feb. 2, 2017, 6 pages.

*Primary Examiner* — Sophia Nguyen
(74) *Attorney, Agent, or Firm* — TraskBritt (57) ABSTRACT

A semiconductor structure and a method of fabricating thereof are provided. The method includes the following steps. A substrate with an upper surface and a lower surface is received. A first recess extending from the upper surface to the lower surface is formed and the first recess has a first depth. A second recess extending from the upper surface to the lower surface is formed and the second recess has a second depth less than the first depth. A first conducting layer is formed in the first recess and the second recess. A first insulating layer is formed over the first conducting layer. A second conducting layer is formed over the first insulating layer and isolated from the first conducting layer with the first insulating layer. The substrate is thinned from the lower surface to expose the second conducting layer in the first recess.

15 Claims, 6 Drawing Sheets

(51) Int. Cl.
*H01L 29/66* (2006.01)
*H01L 21/768* (2006.01)
*H01L 21/306* (2006.01)
*H01L 29/92* (2006.01)
*C23C 14/16* (2006.01)
*C23C 16/06* (2006.01)
*C23C 16/40* (2006.01)
*C23C 16/34* (2006.01)
*C23C 14/06* (2006.01)
*C23C 14/10* (2006.01)
*C23C 14/08* (2006.01)
*H01L 21/3065* (2006.01)
*H01L 23/48* (2006.01)

(52) U.S. Cl.
CPC .............. *C23C 14/10* (2013.01); *C23C 14/16* (2013.01); *C23C 16/06* (2013.01); *C23C 16/345* (2013.01); *C23C 16/402* (2013.01); *H01L 21/304* (2013.01); *H01L 21/3065* (2013.01); *H01L 21/30625* (2013.01); *H01L 21/7684* (2013.01); *H01L 21/76841* (2013.01); *H01L 21/76877* (2013.01); *H01L 21/76895* (2013.01); *H01L 21/76898* (2013.01); *H01L 23/481* (2013.01); *H01L 29/66181* (2013.01); *H01L 29/92* (2013.01); *H01L 21/76865* (2013.01); *H01L 21/76883* (2013.01); *H01L 28/90* (2013.01)

(58) Field of Classification Search
CPC ......... H01L 21/76841; H01L 21/76865; H01L 21/304; H01L 21/30625; H01L 21/3065; H01L 23/481; H01L 28/91; H01L 21/76883

See application file for complete search history.

(56) References Cited

U.S. PATENT DOCUMENTS

| | | | |
|---|---|---|---|
| 8,525,296 B1* | 9/2013 | Lin | H01L 29/945 257/532 |
| 9,224,796 B2* | 12/2015 | Colonna | H01L 28/40 |
| 9,397,038 B1* | 7/2016 | Uzoh | H01L 23/5223 |
| 2004/0108587 A1* | 6/2004 | Chudzik | H01L 23/50 257/700 |
| 2006/0001174 A1* | 1/2006 | Matsui | H01L 21/76898 257/774 |
| 2008/0113505 A1* | 5/2008 | Sparks | H01L 21/76898 438/637 |
| 2008/0173993 A1* | 7/2008 | Andry | H01G 4/236 257/678 |
| 2009/0267183 A1* | 10/2009 | Temple | H01L 21/76898 257/532 |
| 2010/0041203 A1* | 2/2010 | Collins | H01L 23/481 438/386 |
| 2011/0027962 A1* | 2/2011 | Bernstein | H01L 21/3065 438/386 |
| 2012/0049322 A1* | 3/2012 | Su | H01L 21/76898 257/532 |
| 2012/0091593 A1* | 4/2012 | Cheng | H01L 21/743 257/774 |
| 2012/0133021 A1* | 5/2012 | Joblot | H01L 21/76898 257/532 |
| 2013/0161796 A1* | 6/2013 | Huang | H01L 23/481 257/621 |
| 2014/0367828 A1* | 12/2014 | Colonna | H01L 28/40 257/532 |
| 2015/0028450 A1* | 1/2015 | Park | H01L 23/481 257/532 |

* cited by examiner

METHODS OF FABRICATING A SEMICONDUCTOR STRUCTURE

BACKGROUND

Description of Related Art

In order to continue to improve functionality and performance of integrated circuits, the industry has recently been developing technology to enable vertical integration of semiconductor device, known generally as three-dimensional (3D) stacking technology. Typically, through-silicon-via (TSV) is becoming a viable approach for improving chip performance and on-chip decoupling capacitors (decaps) serving as a charge reservoir and are used to support instantaneous current surges, suppress power fluctuation and prevent noise-related circuit degradation in integrated circuits.

Conventional on-chip decoupling capacitors may be planar-type or trench-type. Because trench-type capacitors have a capacitance density advantage over planar-type capacitors, the trench-type capacitors are usually used in semiconductor devices. Therefore, the demands to forming TSVs and trench-type capacitors simultaneously have increased. However, traditional fabricating methods are expensive because of complex and costly processes. For example, sacrificial layers are usually used in fabrication steps.

Accordingly, an improved semiconductor structure which includes a capacitor structure and a via structure and a fabricating method of the semiconductor structure are required.

SUMMARY

The instant disclosure provides a method of fabricating a semiconductor structure, and the method includes following steps. A substrate with an upper surface and a lower surface is received. A first recess extending from the upper surface to the lower surface is formed and the first recess has a first depth. A second recess extending from the upper surface to the lower surface is formed and the second recess has a second depth less than the first depth. A first conducting layer is formed in the first recess and the second recess. A first insulating layer is formed over the first conducting layer. A second conducting layer is formed over the first insulating layer and isolated from the first conducting layer with the first insulating layer. The substrate is thinned from the lower surface to expose the second conducting layer in the first recess.

In various embodiments of the instant disclosure, forming the first recess and the second recess are by laser drilling, dry etching or wet etching.

In various embodiments of the instant disclosure, the dry etching includes reactive ion etching (RIE).

In various embodiments of the instant disclosure, forming the first recess and forming the second recess include forming a photoresist layer over the upper surface, wherein the photoresist layer has a first opening and a second opening smaller than the first opening. Next, the substrate is etched through the first opening to form the first recess and through the second opening to form the second recess.

In various embodiments of the instant disclosure, the first conducting layer in the second recess is exposed after thinning the substrate from the lower surface.

In various embodiments of the instant disclosure, thinning the substrate from the lower surface stops before exposing the first conducting layer in the second recess.

In various embodiments of the instant disclosure, thinning the substrate from the lower surface is by backside grinding, chemical mechanical polishing or blanket etching process.

In various embodiments of the instant disclosure, a first dimension of the first recess is larger than a second dimension of the second recess.

In various embodiments of the instant disclosure, forming the first conducting layer and the second conducting layer are by chemical vapor deposition (CVD), atomic layer deposition (ALD), physical vapor deposition (PVD) or plasma-enhanced chemical vapor deposition (PECVD).

In various embodiments of the instant disclosure, the method further includes forming a second insulating layer in the first recess and the second recess before forming the first conducting layer in the first recess and the second recess.

In various embodiments of the instant disclosure, forming the first insulating layer and the second insulating layer are by CVD, ALD, PVD or PECVD.

The instant disclosure provides a semiconductor structure. The semiconductor structure includes a substrate and a via structure through the substrate. The substrate is with an upper surface and a lower surface. The via structure includes a first inner conductor, a first outmost conductor, and a first inner insulator. The first outmost conductor surrounds the first inner conductor and is coaxial with the first inner conductor. The first inner insulator is between the first inner conductor and the first outmost conductor and exposes from the first inner conductor and the second outmost conductor.

In various embodiments of the instant disclosure, the semiconductor structure further includes a capacitor structure in the substrate. The capacitor structure includes a second inner conductor, a second outmost conductor, and a second inner insulator. The second outmost conductor surrounds the second inner conductor and is coaxial with the second inner conductor. The second inner insulator is between the second inner conductor and the second outmost conductor, wherein the second outmost conductor is isolated from the second inner conductor with the second inner insulator.

In various embodiments of the instant disclosure, the substrate has a thickness and the first inner insulator has a height equal to the thickness.

In various embodiments of the instant disclosure, a first dimension of the via structure is larger than a second dimension of the capacitor structure.

In various embodiments of the instant disclosure, the semiconductor structure further includes an upper metal layer over the upper surface. The upper metal layer is in contact with the second inner conductor and the second outmost conductor.

In various embodiments of the instant disclosure, the semiconductor structure further includes a first outmost insulator separating the first outmost conductor from the substrate and a second outmost insulator separating the second outmost conductor from the substrate.

In various embodiments of the instant disclosure, the capacitor structure penetrates through the substrate.

In various embodiments of the instant disclosure, the semiconductor structure further includes an upper metal layer over the upper surface and a lower metal layer under the lower surface. The upper metal layer is in contact with the second inner conductor and the lower metal layer is in contact with the second outmost conductor.

In various embodiments of the instant disclosure, the semiconductor structure further includes a first outmost insulator separating the first outmost conductor from the substrate and a second outmost insulator separating the second outmost conductor from the substrate.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

It will be understood that when an element is referred to as being "on" another element, it can be directly on the other element or intervening elements may be present therebetween. Furthermore, relative terms, such as "lower" or "bottom" and "upper" or "top", may be used herein to describe one element's relationship to another element as illustrated in the figures. It will be understood that relative terms are intended to encompass different orientations of the device in addition to the orientation depicted in the figures.

As aforementioned problems, traditional method of fabricating TSVs and trench-type capacitors simultaneously is complex and costly. Accordingly, the instant disclosure provides a semiconductor structure which includes a capacitor structure and a via structure and a fabricating method of the semiconductor structure. The fabricating method of the instant disclosure skips the process using sacrificial layers and the capacitor structure and the via structure can be formed with same etching processes such that the fabricating method has a simpler process flow and a lower process cost.

Figure 1A:
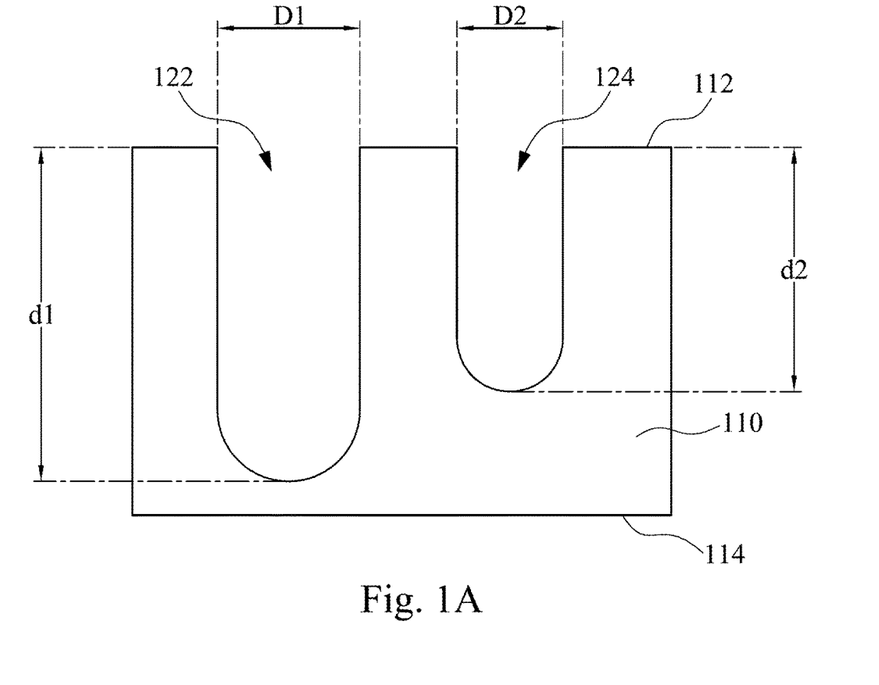
FIG. 1A-1J are cross-sectional views of a semiconductor structure at various stages of fabrication, in accordance with various embodiments.

FIGS. 1A-1J are cross-sectional views of a semiconductor structure at various stages of fabrication, in accordance with various embodiments. As shown in FIG. 1A, a substrate 110 with an upper surface 112 and a lower surface 114 is received. A first recess 122 extending from the upper surface 112 to the lower surface 114 is formed and the first recess 112 has a first depth d1. A second recess 124 extending from the upper surface 112 to the lower surface 114 is formed and the second recess 124 has a second depth d2 less than the first depth d1.

In various embodiments, the substrate 110 is silicon wafer or die, which may includes passive components such as resistors, capacitors, inductors, and active components, such as N-channel field effect transistors (NFETs), P-channel field effect transistors (PFETs), metal-oxide-semiconductor field effect transistors (MOSFETs), complementary metal-oxide-semiconductor (CMOSs) transistors, high voltage transistors, and/or high frequency transistors, other suitable components, and/or combinations thereof. The silicon wafer includes a material of Si, SiGe, SiGeC or SiC, a layered semiconductor such as Si/SiGe or a silicon-on-insulator (SOI). It is further understood that additional features may be added in the substrate 110.

In various embodiments, the first recess 122 and the second recess 124 are formed by laser drilling, dry etching or wet etching. For example, the dry etching includes reactive ion etching (RIE) such as cryogenic deep reactive ion etching or Bosch deep reactive ion etching.

In one embodiment, the first recess 122 and the second recess 124 are formed by following steps. A photoresist layer (not shown) is formed over the upper surface 112 of the substrate 110, which has a first opening and a second opening smaller than the first opening. Subsequently, the substrate 110 is etched through the first opening to form the first recess 122 and through the second opening to form the second recess 124. Because the first opening is larger than the second opening, a first dimension D1 of the first recess 122 is larger than a second dimension D2 of the second recess 124 as shown in FIG. 1A. For example, the first recess 122 and the second recess 124 are etched out of the substrate 110 by a dry etching such as RIE. Therefore, the depth of the first recess 122 and the second recess 124 can be controlled by RIE lag because the first opening is larger than the second opening.

In various embodiments, a pad layer (not shown) is optionally formed between the photoresist layer and the upper surface 112 of the substrate 110. The pad layer may be made of any suitable materials such as $SiO_2$, or $Si_3N_4$.

Figure 1B:
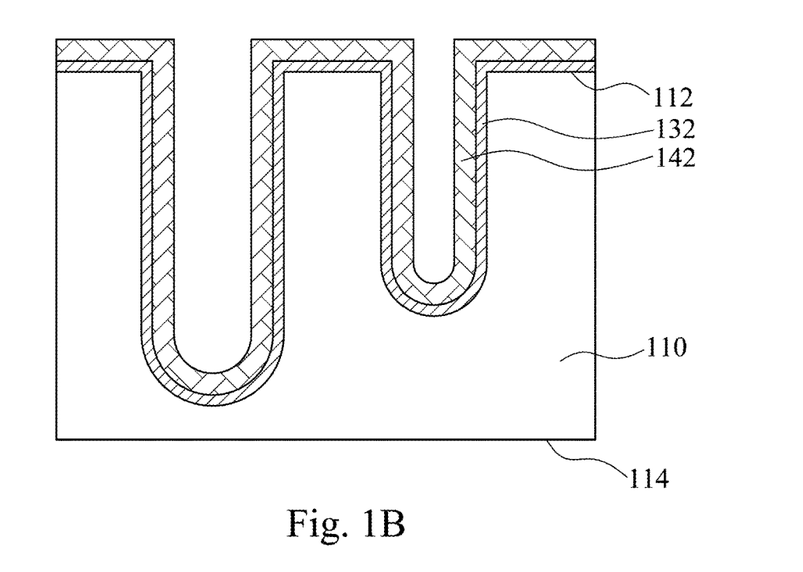

As shown in FIG. 1B, a second insulating layer 132 is formed in the first recess 122 and the second recess 124. Subsequently, a first conducting layer 142 is formed over the second insulating layer 132 in the first recess 122 and the second recess 124. Therefore, the second insulating layer 132 separates the first conducting layer 142 from the substrate 110 to avoid the current leakage and reduce the parasitic capacitance. In various embodiments, the second insulating layer 132 may be omitted. In various embodiments, the second insulating layer 132 is formed by chemical vapor deposition (CVD), atomic layer deposition (ALD), physical vapor deposition (PVD) or plasma-enhanced chemical vapor deposition (PECVD) and is made of silicon dioxide or silicon nitride. In various embodiments, the first conducting layer 142 is formed by CVD, ALD, PVD or PECVD and is made of any suitable material such as tungsten, aluminum, copper, polysilicon or an alloy.

Figure 1C:
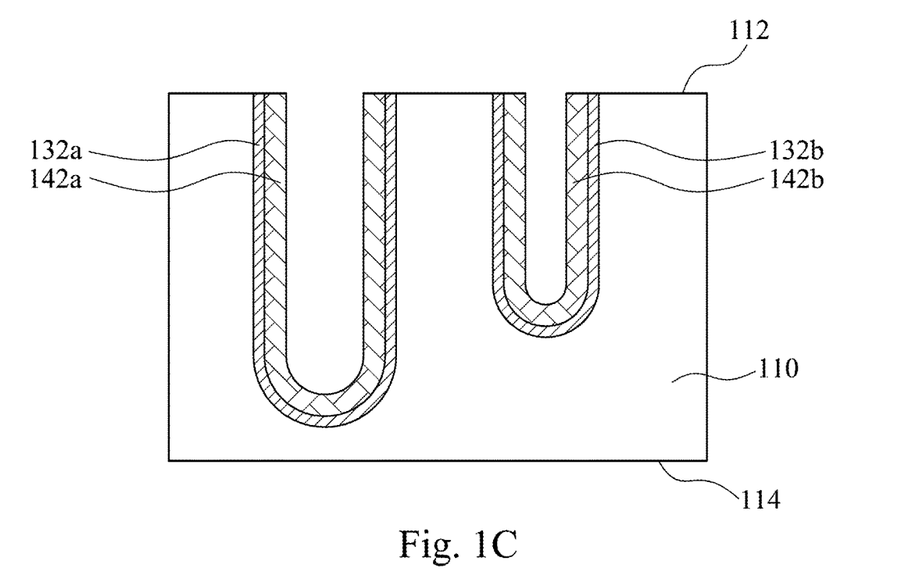

As shown in FIG. 1C, a portion of the second insulating layer 132 and a portion of the first conducting layer 142 are removed by polishing such as chemical-mechanical polishing (CMP) to form a first outmost insulator 132a and a first outmost conductor 142a in the first recess 122 and to form a second outmost insulator 132b and a second outmost conductor 142b in the second recess 124.

Figure 1D:
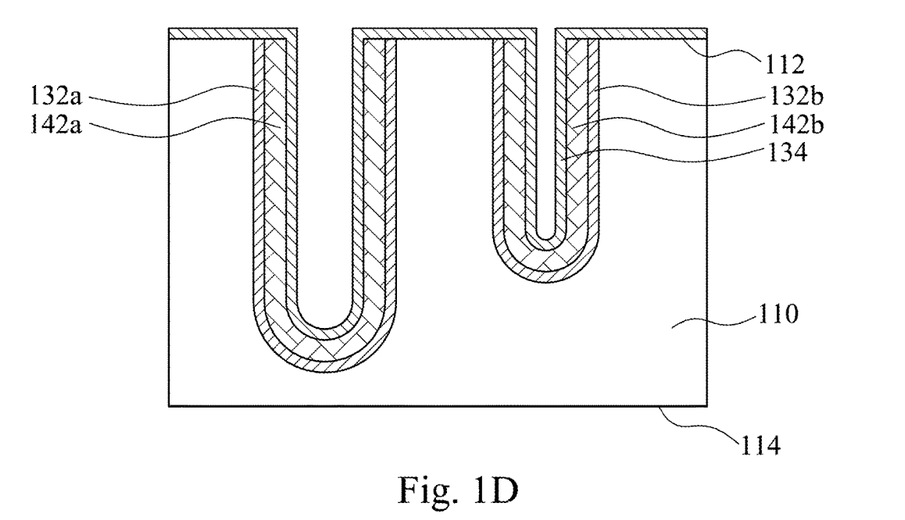
Figure 1E:
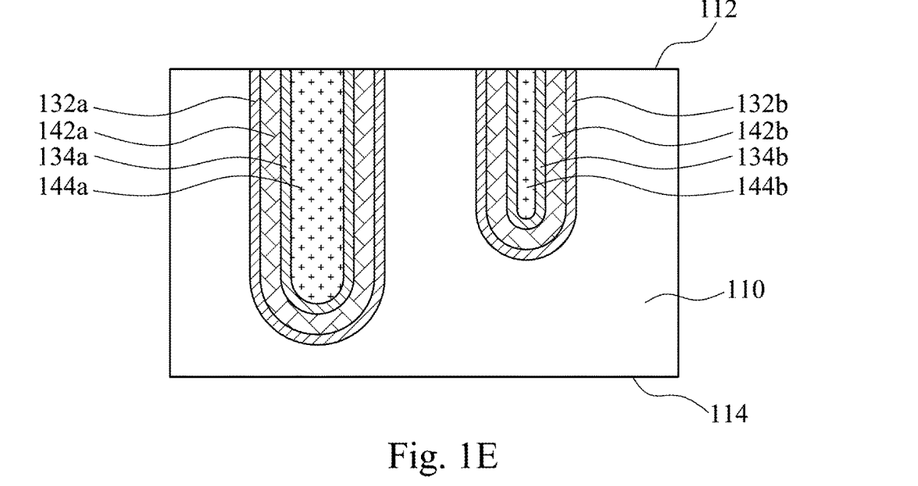

As shown in FIG. 1D, a first insulating layer 134 is formed over the first outmost insulator 132a, the first outmost conductor 142a, the second outmost insulator 132b, the second outmost conductor 142b and the substrate 110. The first insulating layer 134 is then polished to form a first inner insulator 134a in the first recess 122 and a second inner insulator 134b in the second recess 124 as shown in FIG. 1E. Subsequently, a second conducting layer (not shown) is formed over the first inner insulator 134a and second inner insulator 134b and the second conducting layer is then polished to form a first inner conductor 144a in the first recess 122 and a second inner conductor 144b in the second recess 124. Therefore, the first inner conductor 144a is isolated from the first outmost conductor 142a with the first inner insulator 134a and the second inner conductor 144b is isolated from the second outmost conductor 142b with the second inner insulator 134b.

More specifically, the first outmost insulator 132a surrounds the first outmost conductor 142a which surrounds the first inner insulator 134a. Further, the first inner insulator 134a surrounds the first inner conductor 144a. Accordingly, the first inner conductor 144a, the first inner insulator 134a, the first outmost conductor 142a and the first outmost insulator 132a are coaxial. Similarly, the second outmost insulator 132b surrounds the second outmost conductor 142b which surrounds the second inner insulator 134b. Further, the second inner insulator 134b surrounds the second inner conductor 144b. Accordingly, the second inner conductor 144b, the second inner insulator 134b, the second outmost conductor 142b and the second outmost insulator 132b are coaxial as well.

In various embodiments, the first insulating layer 134 is formed by CVD, ALD, PVD or PECVD and is made of silicon dioxide or silicon nitride. In various embodiments, the second conducting layer is formed by CVD, ALD, PVD or PECVD and is made of any suitable material such as tungsten, aluminum, copper, polysilicon or alloy.

Figure 1F:
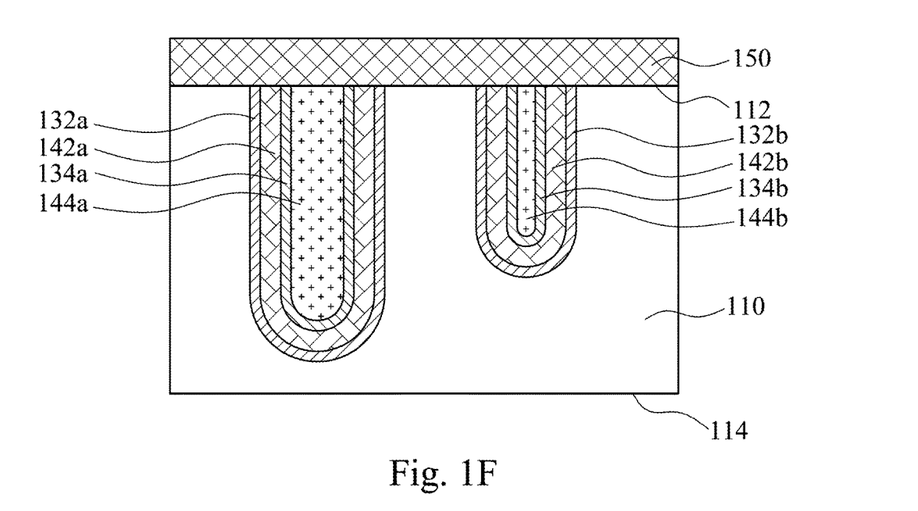
Figure 1G:
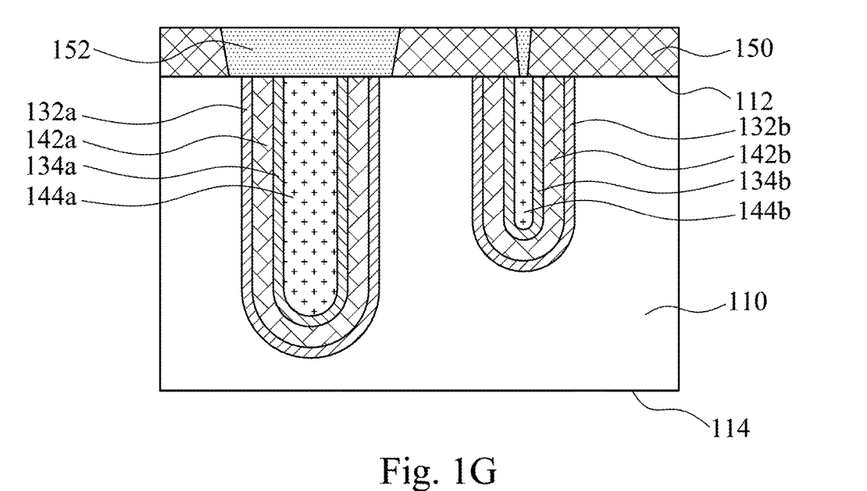

As shown in FIG. 1F, an upper insulating layer 150 is formed over the upper surface 112 of the substrate 110. Subsequently, the upper insulating layer 150 is patterned to form some openings and the openings are then filled with an upper metal layer 152 as shown in FIG. 1G. It is worth noting that the upper metal layer 152 is in contact with the first outmost insulator 132a, the first outmost conductor 142a, the first inner insulator 134a, the first inner conductor 144a and the second inner conductor 144b.

Figure 1H:
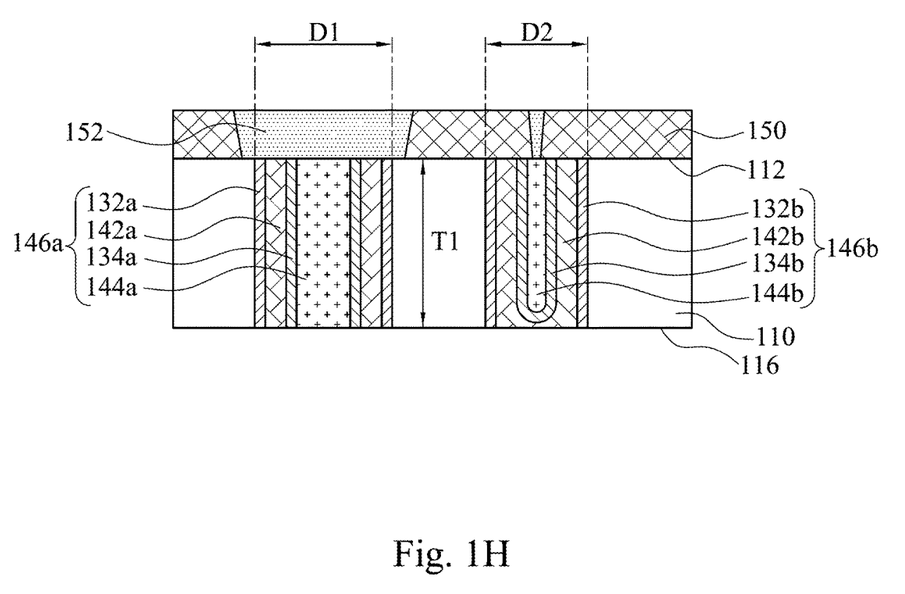

As shown in FIG. 1H, the substrate 110 is thinned from the lower surface 114 to expose a lower surface 116 of the substrate 110, the first inner conductor 144a, the first inner insulator 134a, the first outmost conductor 142a, the first outmost insulator 132a, the second outmost conductor 142b and the second outmost insulator 132b to form a via structure 146a and a capacitor structure 146b. Specifically, the via structure 146a includes the first inner conductor 144a, the first inner insulator 134a, the first outmost conductor 142a and the first outmost insulator 132a and has the first dimension D1. The capacitor structure 146b includes the second inner conductor 144b, the second inner insulator 134b, the second outmost conductor 142b and the second outmost insulator 132b and has the second dimension D2 smaller than the first dimension D1. Both the via structure 146a and the capacitor structure 146b extend through the substrate 110. It is worth noting that the first inner insulator 134a exposes from the first outmost conductor 142a and the first inner conductor 144a and has a height equal to a thickness T1 of the substrate 110 as shown in FIG. 1H. Further, the first inner insulator 134a is coplanar with the upper surface 112 and the lower surface 116 of the substrate 110. In the capacitor structure 146b, the second inner conductor 144b is isolated from the second outmost conductor 142b.

In other words, the substrate 110 is thinned from the lower surface 114 to expose the first inner conductor 144a and the second outmost conductor 142b, namely, the substrate 110 is thinned from the lower surface 114 to expose the second conducting layer in the first recess 122 and the first conducting layer 142 in the second recess 124.

In various embodiments, the substrate 110 is thinned from the lower surface 114 by backside grinding, chemical mechanical polishing or blanket etching process.

Figure 1I:
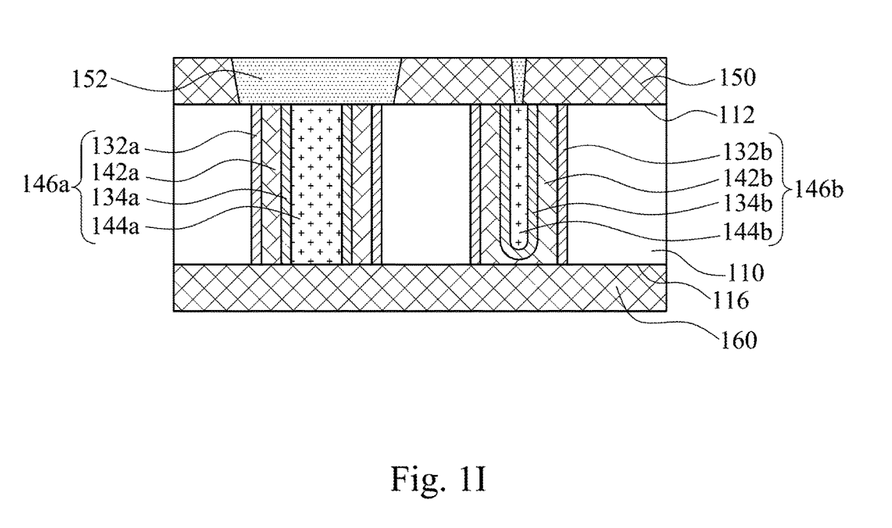
Figure 1J:
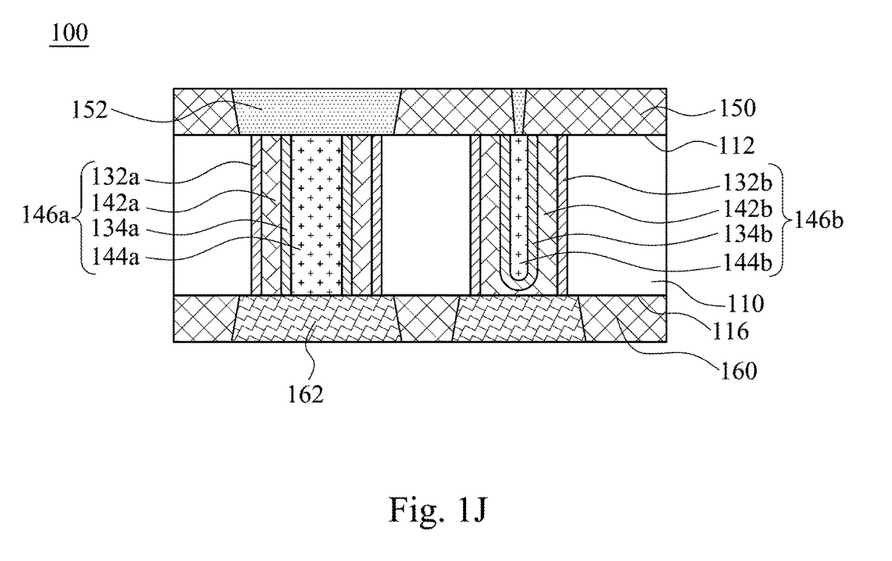

As shown in FIG. 1I, a lower insulating layer 160 is formed under the lower surface 116 of the substrate 110. Subsequently, the lower insulating layer 160 is patterned to form some openings and the openings are then filled with a lower metal layer 162 to form a semiconductor structure 100 as shown in FIG. 1J. It is worth noting that the lower metal layer 162 is in contact with the first outmost insulator 132a, the first outmost conductor 142a, the first inner insulator 134a, the first inner conductor 144a, the second outmost insulator 132b and the second outmost conductor 142b. Therefore, the upper metal layer 152 can electrically connect with the lower metal layer 162 through the via structure 146a which allows current to flow through the substrate 110.

Figure 2A:
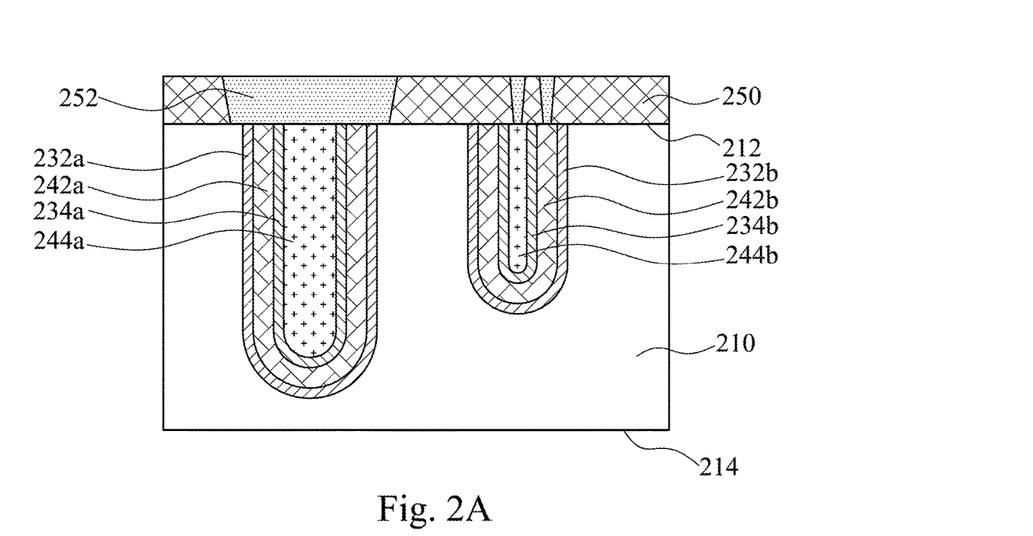
FIG. 2A-2B are cross-sectional views of a semiconductor structure at various stages of fabrication, in accordance with various embodiments.
Figure 2B:
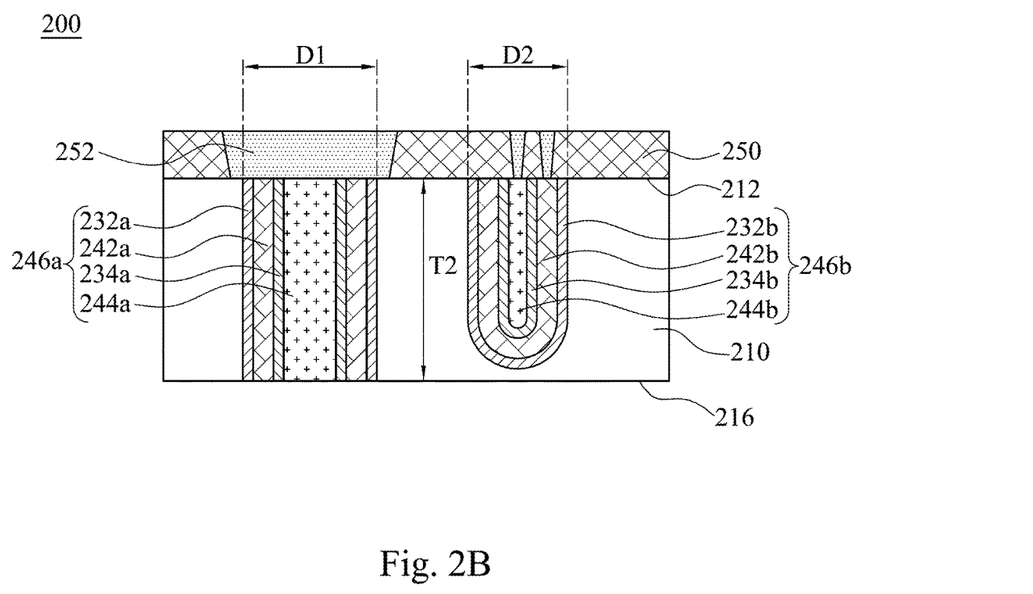

FIGS. 2A-2B are cross-sectional views of a semiconductor structure 200 at various stages of fabrication, in accordance with various embodiments. As shown in FIG. 2A, a substrate 210 with an upper surface 212 and a lower surface 214 is received. A first outmost insulator 232a surrounds a first outmost conductor 242a which surrounds a first inner insulator 234a. Further, the first inner insulator 234a surrounds a first inner conductor 244a. Accordingly, the first inner conductor 244a, the first inner insulator 234a, the first outmost conductor 242a and the first outmost insulator 232a are coaxial. Similarly, a second outmost insulator 232b surrounds a second outmost conductor 242b which surrounds a second inner insulator 234b. Further, the second inner insulator 234b surrounds a second inner conductor 244b. Accordingly, the second inner conductor 244b, the second inner insulator 234b, the second outmost conductor 242b and the second outmost insulator 232b are coaxial as well. The fabrication process of above configuration shown in FIG. 2A is same as FIGS. 1A-1E shown.

Further, after an upper insulating layer 250 is formed over the upper surface 212 of the substrate 210, the upper insulating layer 250 is patterned to form some openings and the openings are then filled with an upper metal layer 252 as shown in FIG. 2A. It is worth noting that the upper metal layer 252 is in contact with the first outmost insulator 232a, the first outmost conductor 242a, the first inner insulator 234a, the first inner conductor 244a, the second inner conductor 244b and the second outmost conductor 242b which is isolated from the second inner conductor 244b with the second inner insulator 234b.

As shown in FIG. 2B, the substrate 210 is thinned from the lower surface 214 to expose a lower surface 216 of the substrate 210, the first inner conductor 244a, the first inner insulator 234a, the first outmost conductor 242a and the first outmost insulator 232a to form a via structure 246a and a capacitor structure 246b. In other words, thinning the substrate 210 from the lower surface 214 stops before exposing the second inner conductor 244b. More specifically, the via structure 246a includes the first inner conductor 244a, the first inner insulator 234a, the first outmost conductor 242a and the first outmost insulator 232a and has the first dimension D1. Only the via structure 246a penetrates through the substrate 210. It is worth noting that the first inner insulator 234a exposes from the first outmost conductor 242a and the first inner conductor 244a and has a height equal to a thickness T2 of the substrate 210 as shown in FIG. 2B. Further, the first inner insulator 234a is coplanar with the upper surface 212 and the lower surface 216 of the substrate 210.

Further, the capacitor structure 246b includes the second inner conductor 244b, the second inner insulator 234b, the second outmost conductor 242b and the second outmost insulator 232b and has the second dimension D2 smaller than the first dimension D1. In the capacitor structure 246b, the second inner conductor 244b is isolated from the second outmost conductor 242b.

Furthermore, a lower insulating layer (not shown) may be formed under the lower surface 216 and then patterned to form some openings. The openings are continuously filled with a lower metal layer (not shown). Therefore, the upper metal layer 252 can electrically connect with the lower metal layer through the via structure 246a which allows current to flow through the substrate 210.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A method of fabricating a semiconductor structure, comprising:
   forming a first recess extending from an upper surface toward a lower surface of a material, the first recess having a first depth;
   forming a second recess extending from the upper surface toward the lower surface, the second recess having a second depth less than the first depth;
   forming a first insulating layer in the first recess and the second recess;
   forming a first conducting layer in the first recess and the second recess and over the first insulating layer;
   forming a second insulating layer over the first conducting layer and in the first recess and the second recess;
   forming a second conducting layer over the second insulating layer and in the first recess and the second recess, the second conducting layer isolated from the first conducting layer with the second insulating layer;
   thinning the material from the lower surface to expose the first insulating layer, the first conducting layer, the second insulating layer, and the second conducting layer in the first recess and the first insulating layer and the first conducting layer in the second recess;
   forming a metal layer in direct contact with a portion of the upper surface of the material, with the first insulating layer, the first conducting layer, the second insulating layer, and the second conducting layer in the first recess, and with the second conducting layer in the second recess; and
   forming another metal layer in direct contact with a portion of the lower surface of the material, with the first insulating layer, the first conducting layer, the second insulating layer, and the second conducting layer in the first recess, and with the first insulating layer and the first conducting layer in the second recess.

2. The method of claim 1, wherein forming the first recess and forming the second recess comprises forming the first recess and the second recess by laser drilling, dry etching or wet etching.

3. The method of claim 2, wherein forming the first recess and forming the second recess comprises forming the first recess and the second recess by reactive ion etching.

4. The method of claim 1, wherein forming the first recess and forming the second recess comprise:
   forming a photoresist layer over the upper surface of the material, the photoresist layer having a first opening and a second opening smaller than the first opening; and
   etching the material through the first opening to form the first recess and through the second opening to form the second recess.

5. The method of claim 1, wherein thinning the material from the lower surface comprises thinning the material by backside grinding, chemical-mechanical polishing or blanket etching.

6. The method of claim 1, wherein forming the first recess and forming the second recess comprises forming a first dimension of the first recess larger than a second dimension of the second recess.

7. The method of claim 1, wherein forming the first conducting layer and the second conducting layer comprises forming the first conducting layer and the second conducting layer by chemical vapor deposition (CVD), atomic layer deposition (ALD), physical vapor deposition (PVD) or plasma-enhanced chemical-vapor deposition (PECVD).

8. The method of claim 1, wherein forming the first insulating layer and forming the second insulating layer comprises forming the first insulating layer and the second insulating layer by CVD, ALD, PVD or PECVD.

9. The method of claim 1, wherein thinning the material from the lower surface to expose the first insulating layer, the first conducting layer, the second insulating layer, and the second conducting layer in the first recess comprises forming a via structure comprising the first insulating layer, the first conducting layer, the second insulating layer, and the second conducting layer in the first recess.

10. The method of claim 9, wherein forming the metal layer in direct contact with a portion of the upper surface of the material comprises forming the metal layer in direct contact with the first insulating layer, the first conducting layer, the second insulating layer, and the second conducting layer of the via structure.

11. The method of claim 1, wherein thinning the material from the lower surface to expose the first insulating layer, the first conducting layer, the second insulating layer, and the second conducting layer in the first recess and the first insulating layer and the first conducting layer in the second recess comprises forming a capacitor structure comprising the first insulating layer, the first conducting layer, the second insulating layer, and the second conducting layer in the second recess.

12. The method of claim 11, wherein forming the metal layer in direct contact with a portion of the upper surface of the material comprises forming the metal layer only on the second conducting layer of the capacitor structure.

13. The method of claim 1, wherein forming the first conducting layer in the first recess and the second recess, forming the second insulating layer over the first conducting layer and in the first recess and the second recess, and forming the second conducting layer over the second insulating layer and in the first recess and the second recess comprises completely filling the first recess and the second recess.

14. A method of fabricating a semiconductor structure, comprising:
    forming a first recess in an upper surface of a material, the first recess having a first depth;
    forming a second recess in the upper surface of the material, the second recess having a second depth less than the first depth;
    forming a first insulating layer in the first recess and the second recess;
    forming a first conducting layer in the first recess and the second recess and over the first insulating layer;
    forming a second insulating layer over the second conducting layer and in the first recess and the second recess;
    forming a second conducting layer over the first insulating layer and in the first recess and the second recess;
    thinning the material from a lower surface of the material to expose the first insulating layer, the first conducting layer, the second insulating layer, and the second conducting layer in the first recess and the first insulating layer and the first conducting layer in the second recess;
    forming a metal in direct contact with the upper surface of the material and the first conducting layer, the first insulating layer, the second conducting layer, and the second insulating layer in the first recess and in direct contact with only the second conducting layer in the second recess; and
    forming another metal in direct contact with the first insulating layer, the first conducting layer, the second insulating layer, and the second conducting layer in the first recess, with the first insulating layer and the first conducting layer in the second recess, and with only a portion of the lower surface of the material.

15. The method of claim 14, wherein forming the second conducting layer over the first insulating layer and in the first recess and the second recess comprises forming the second conducting layer in the second recess, the second conducting layer isolated from the first conducting layer in the second recess.

* * * * *

UNITED STATES PATENT AND TRADEMARK OFFICE
CERTIFICATE OF CORRECTION

PATENT NO. : 10,121,849 B2
APPLICATION NO. : 14/941665
DATED : November 6, 2018
INVENTOR(S) : Tieh-Chiang Wu and Shing-Yih Shih It is certified that error appears in the above-identified patent and that said Letters Patent is hereby corrected as shown below:

On the Title Page

In ITEM (72) Inventors:
Line 1, change "Taoyuan" to --Taoyuan City--
Line 2, change "New Taipei" to --New Taipei City--

In the Specification

| | | |
|---|---|---|
| Column 1, | Line 29, | change "structure and" to --structure, and-- |
| Column 1, | Line 36, | change "includes following" to --includes the following-- |
| Column 2, | Line 3, | change "chemical mechanical" to --chemical-mechanical-- |
| Column 2, | Line 22, | change "is with an" to --has an-- |
| Column 2, | Line 28, | change "and exposes from" to --and separates-- |
| Column 3, | Line 8, | change "examples," to --way of example,-- |
| Column 3, | Line 13, | change "can be" to --may be-- |
| Column 3, | Line 16, | change "FIG. 1A-1J" to --FIGS. 1A-1J-- |
| Column 3, | Line 19, | change "FIG. 2A-2B" to --FIGS. 2A-2B-- |
| Column 3, | Lines 45-46, | change "or"bottom"" to --or "bottom"-- |
| Column 3, | Line 46, | change ""top"," to --"top,"-- |
| Column 3, | Line 51, | change "traditional method" to --traditional methods-- |
| Column 3, | Line 54, | change "structure which" to --structure that-- |
| Column 3, | Line 55, | change "via structure and" to --via structure, and-- |
| Column 3, | Line 57, | change "process using" to --process of using-- |
| Column 4, | Line 4, | change "is silicon" to --is a silicon-- |
| Column 4, | Line 5, | change "may includes" to --may include-- |
| Column 4, | Line 10, | change "(CMOSs) transistors, high voltage" to --(CMOS) transistors, high-voltage-- |
| Column 4, | Line 11, | change "high frequency transistors," to --high-frequency transistors,-- |
| Column 4, | Line 13, | change "includes a material" to --may include a material-- |

Signed and Sealed this
Twenty-fifth Day of December, 2018

Andrei Iancu
*Director of the United States Patent and Trademark Office*

CERTIFICATE OF CORRECTION (continued)
U.S. Pat. No. 10,121,849 B2

| | | |
|---|---|---|
| Column 4, | Line 23, | change "by following" to --by the following-- |
| Column 4, | Line 32, | change "recess 124 as" to --recess 124, as-- |
| Column 4, | Line 48, | change "to avoid the current leakage and reduce the" to --to avoid current leakage and reduce-- |
| Column 5, | Line 18, | change "conductor 142*a* which" to --conductor 142*a*, which-- |
| Column 5, | Line 25, | change "142*b* which" to --142*b*, which-- |
| Column 5, | Line 36, | change "or alloy." to --or an alloy.-- |
| Column 5, | Line 63, | change "exposes from the" to --separates the-- |
| Column 5, | Line 65, | change "substrate 110 as" to --substrate 110, as-- |
| Column 6, | Lines 10-11, | change "chemical mechanical" to --chemical-mechanical-- |
| Column 6, | Line 24, | change "146*a* which" to --146*a*, which-- |
| Column 6, | Line 25, | change "FIGS. 2A-2B" to --FIGS. 2A and 2B-- |
| Column 6, | Line 30, | change "conductor 242*a* which" to --conductor 242*a*, which-- |
| Column 6, | Line 36, | change "conductor 242*b* which" to --conductor 242*b*, which-- |
| Column 6, | Line 43, | change "is same as FIGS. 1A-1E shown." to --is the same as shown in FIGS. 1A-1E.-- |
| Column 6, | Line 52, | change "conductor 242*b*" to --conductor 242*b*, which-- |
| Column 7, | Line 1, | change "exposes from the" to --separates the-- |
| Column 7, | Line 27, | change "the structure of" to --the structures of-- |